United States Patent [19]

Meserow et al.

[11] 3,983,480
[45] Sept. 28, 1976

[54] CALIBRATION CIRCUIT AND METHOD

[75] Inventors: Francis P. Meserow, Highland Park; Frank H. Mills, Chicago, both of Ill.

[73] Assignee: Alston, Inc., Chicago, Ill.

[22] Filed: Jan. 29, 1975

[21] Appl. No.: 544,972

[52] U.S. Cl. .............................. 324/169; 73/1 R; 324/78 R; 324/130; 13/2
[51] Int. Cl.² ..................... G01P 21/00; G01P 3/48
[58] Field of Search .................. 324/169, 166, 78 R, 324/130, 74; 73/1 R, 1 C, 1 DC, 2

[56] References Cited
UNITED STATES PATENTS

| | | | |
|---|---|---|---|
| 2,919,401 | 12/1959 | Cole et al. ............................ | 324/74 |
| 2,929,022 | 3/1960 | Carpenter ............................. | 324/70 |
| 3,260,101 | 7/1966 | Ongaro et al. ........................ | 73/1 |
| 3,315,158 | 4/1967 | Ongaro et al. ........................ | 324/70 |

Primary Examiner—R. V. Rolinec
Assistant Examiner—Vincent J. Sunderdick
Attorney, Agent, or Firm—Dressler, Goldsmith, Clement, Gordon & Shore, Ltd.

[57] ABSTRACT

A calibration circuit and method for use with systems of the type displaying values of a measured condition in response to electrical pulses received at the system input in which the repetition rate of the received pulses is representative of the value of the measured condition. Electrical pulses, having a known repetition rate are generated for simulating a value of the measured condition in response to a reference signal of known frequency, the repetition rate of said simulating pulses being determined by the frequency of the reference signal.

4 Claims, 6 Drawing Figures

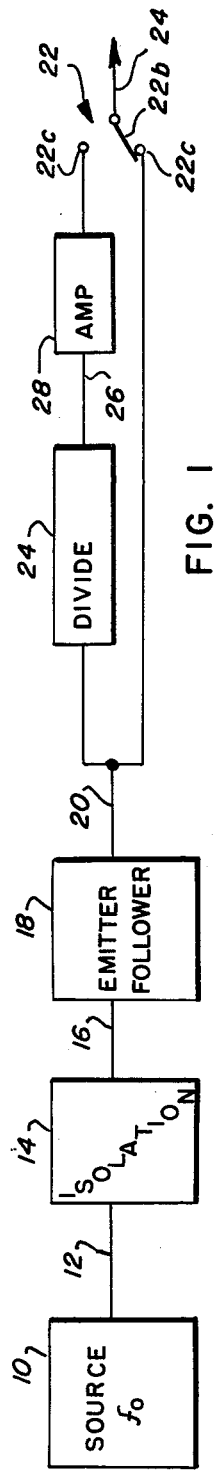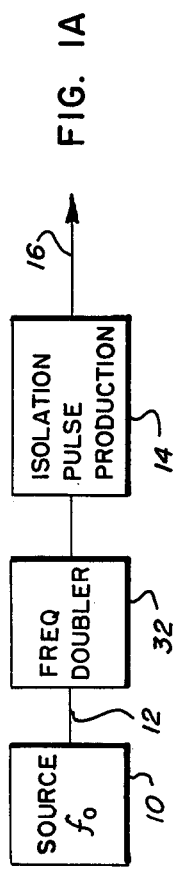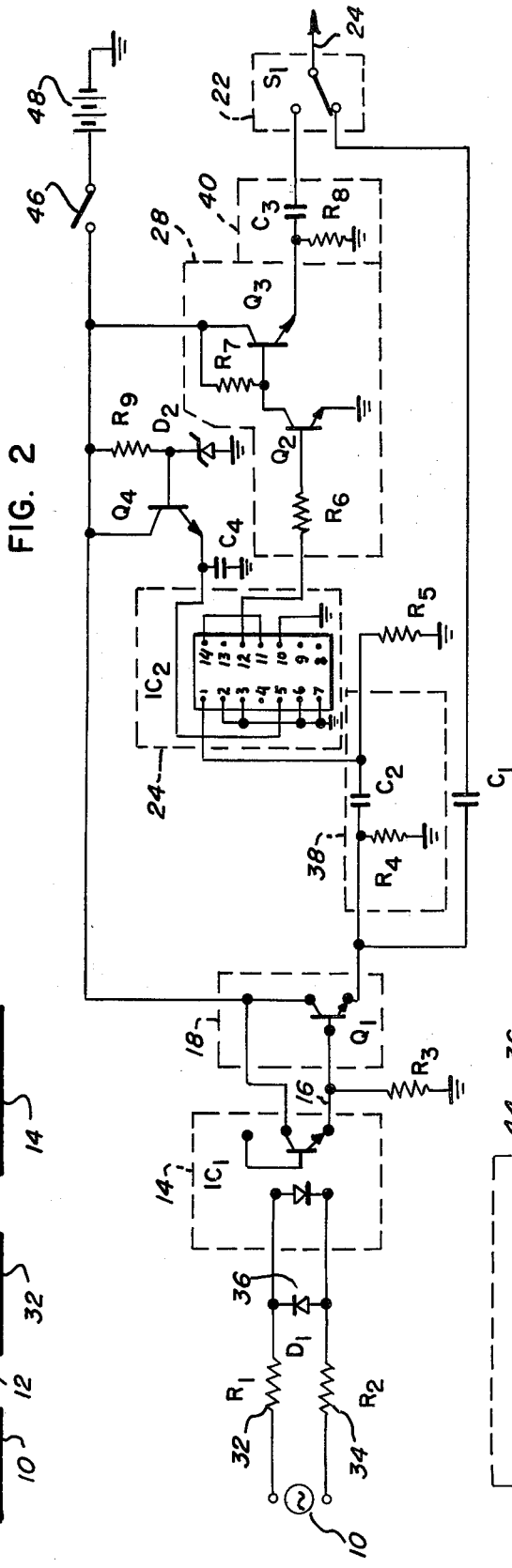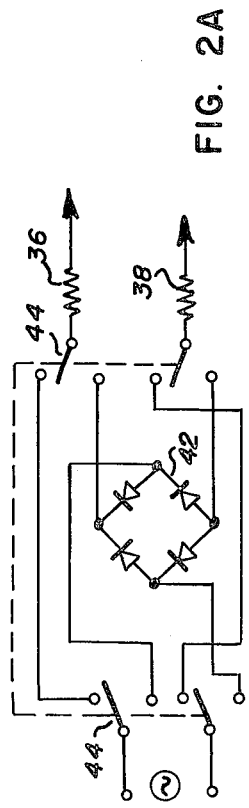
FIG. 1
FIG. 1A
FIG. 2
FIG. 2A

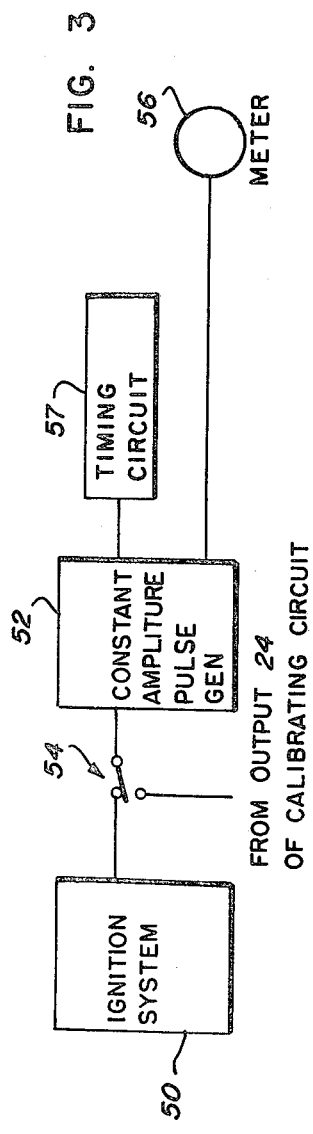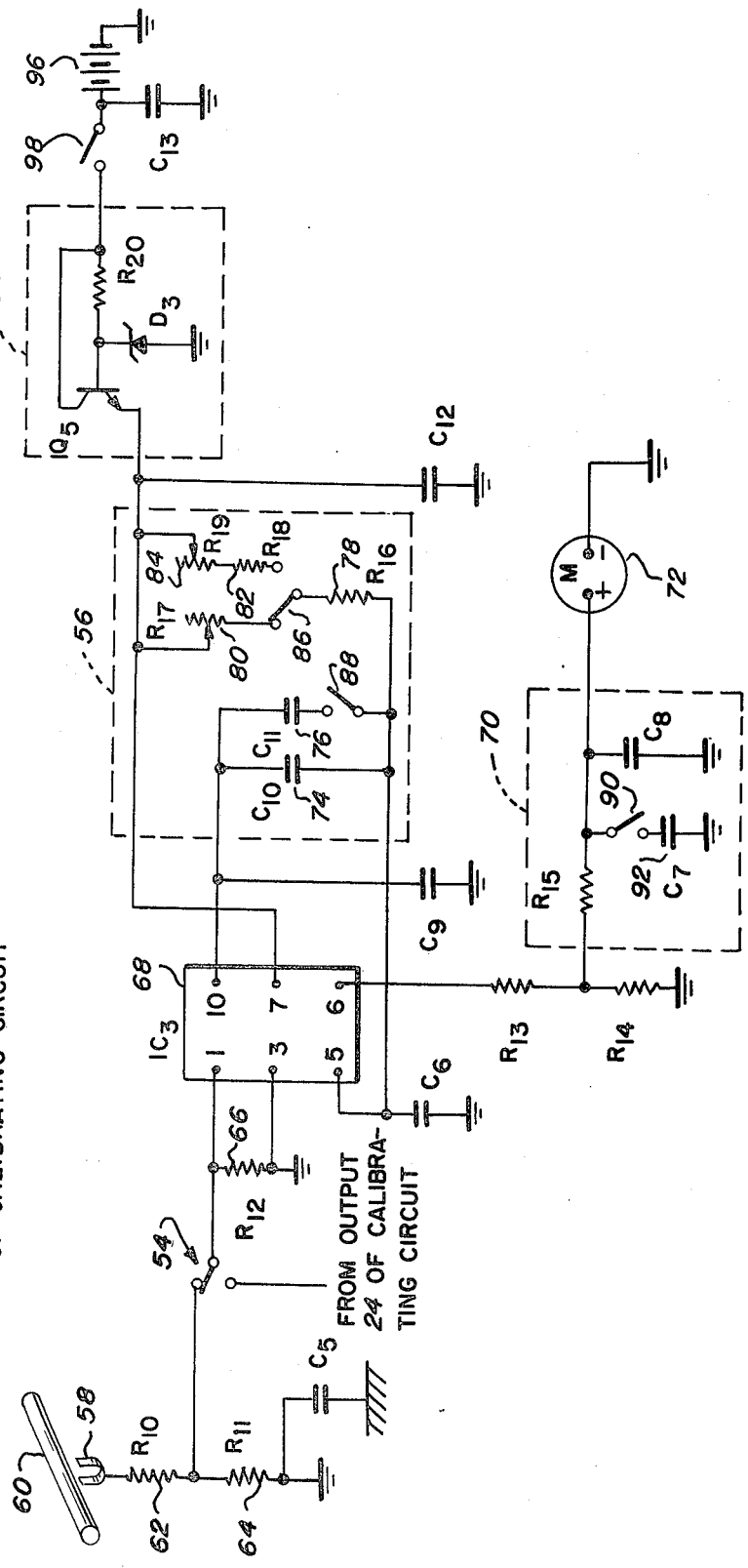

CALIBRATION CIRCUIT AND METHOD

BACKGROUND OF THE INVENTION

The present invention relates to calibration circuits and particularly to calibration circuits for use with systems of the type displaying values of a measured condition in response to electrical pulses having a repetition rate representative of the value of the condition being measured.

Various circuits and systems display values of a measured condition in response to and as a function of the repetition rate of pulses received in which the repetition rate is representative of the value of the condition being measured.

In many instances, such systems are initially calibrated during manufacture to accurately display the value of the measured condition. In use, the system is assumed to remain calibrated and any field calibration is typically a static type calibration in which the display device, such as a meter, is merely "zeroed," on the assumption that when so adjusted the system will accurately display the measured value.

It would be highly desirable, therefore, to have the ability to dynamically calibrate such systems to insure that the measured values are accurately displayed and that the systems respond accurately to the pulse repetition rate of the representative electrical pulses.

SUMMARY OF THE INVENTION

In accordance with the present invention, there is provided a calibration circuit and method for use with systems of the type displaying values of a measured condition in response to electrical pulses received at the system input in which the repetition rate of the received pulses is representative of the value of the measured condition.

A calibration circuit and method in accordance with the present invention generates electrical pulses having a known repetition rate for simulating a value of the measured condition. The simulating electrical pulses are generated in response to a reference signal of known frequency, the repetition rate of said simulating pulses being determined by the frequency of the reference signal.

More specifically, calibration circuit in accordance with the present invention may be conveniently connected to a suitable reference source of known frequency such as the ordinary 60 cycle line. The pulses are produced by an isolating circuit coupled to the source to produce pulses having a repetition rate determined by and, typically equal to the frequency of the source and electrically isolated therefrom.

The generated pulses may be utilized directly as the simulating pulses to be coupled to the system being calibrated or, alternatively, the repetition rate of the pulses may be modified. For example, if it is desired to reduce the repetition rate of the pulses the output of the produced pulses may be divided to produce pulses having a repetition rate which is a fraction of the repetition rate of the pulses as generated.

In either event, pulses of known repetition rate are produced which when applied to the system being calibrated permit accurate calibration of the system by effecting adjustment of the display to reflect a value corresponding to the repetition rate of the simulated pulses.

The calibration circuit and method of the present invention has a particular applicability for the calibration of impulse type tachometers to permit dynamic calibration of such systems conveniently, accurately, and inexpensively.

Numerous other advantages and features of the present invention will become readily apparent from the following detailed description of the invention and of one embodiment thereof, from the claims and from the accompanying drawing in which each and every detail shown is fully and completely disclosed as a part of this specification in which like numerals refer to like parts.

BRIEF DESCRIPTION OF THE DRAWING

FIG. 1 is a block diagrma of a calibration circuit incorporating the present invention;

FIG. 1A is a partial block diagram the system of FIG. 1 showing an alternative embodiment thereof;

FIG. 2 is a circuit diagram of a calibrating circuit incorporating the present invention;

FIG. 2A is a partial circuit diagram of an alternative embodiment;

FIG. 3 is a block diagram of an impulse tachometer; and

FIG. 4 is a circuit diagram of a specific embodiment of an impulse tachometer.

DESCRIPTION OF PREFERRED EMBODIMENTS

While this invention is susceptible of embodiment in many different forms, there is shown in the drawings and will herein be described in detail a preferred embodiment of the invention and modifications thereof, with the understanding that the present disclosure is to be considered as an exemplification of the principles of the invention and is not intended to limit the invention to the embodiments illustrated. The scope of the invention will be pointed out in the appended claims.

In accordance with the present invention, there is disclosed a calibration circuit and method for systems which display values of a measured condition in response to and as a function of the repetition rate of electrical pulses received at the input of the system, the repetition rate of such pulses being determined by the value of the measured condition.

Typical of such a system is an impulse tachometer which displays the measured valves of rotational speed as revolutions per minute (rpm). The measured valve is a function of the repetition rate of pulses received at the tachometer input which in turn is determined by the speed of rotation.

As an example, automotive impulse tachometers display crank shaft rpm as a function of electrical pulses generated by the automotive ignition system. Traditionally, such pulses have been detected from the breaker points and the relationship of the pulse repetition rate to rotational speed is a function of whether the engine is two-cycle or four-cycle and of the number of cylinders of the engine. Alternatively, it is possible to detect pulses generated in one spark plug wires so that the number of pulses so detected has a fixed relationship to the crank shaft rpm. In a four-cycle engine, for example, each spark plug ignites once for every two revolutions of the crank shaft so that the displayed rpm would be twice the number of pulses detected in each spark plug wire.

In either type of system, however, the displayed rpm is a function of the number of pulses received at the tachometer input, i.e., the pulse repetition rate.

A calibrating circuit in accordance with the present invention generates pulses of known repetition rate to simulate a known value of the condition being measured. In the case of an impulse tachometer, the known repetition rate of the electrical pulses generated by the calibration circuit simulates a known rotational speed of an internal combustion engine in accordance with the understood relationship between the pulse repetition rate and the speed of rotation.

FIG. 1 shows a block diagram of a calibration circuit incorporating the present invention including a source 10 generating a reference signal of known frequency $f_o$. The output 12 of the reference source 10 is connected to an isolating circuit 14 which produces pulses at the output 16 thereof which are electrically isolated from the source 10 and occur at a repetition rate determined by the frequency of the reference signal.

The output of the isolator circuit 14 is connected to emitter follower 18. The output 20 of emitter follower 18 is connected to one contact 22a of a coupling switch 22 which, when movable contact 22b is in the position shown connects the output of the amplifier 18 directly to the output 24 of the calibration circuit.

The output 20 of emitter follower 18 is also connected to the input of a divide circuit 24 which produces pulses at its output 28 at a fraction of the repetition rate of the pulses received at its input. The output 28 of the divide circuit 21 is suitably amplified in amplifier 30, the output of which is connected to the output 24 of the calibrating circuit, when contact 22b is operated to engage contact 22c.

One suitable source of known frequency is the ordinary 60 cycle ac line. Since in the illustrated embodiment, the isolation pulse producing circuit produces pulses at a repetition rate equal to the frequency of the reference signal, the simulating electrical pulses at the output 24 will be at a repetition rate of 3600 ppm or at some fraction thereof, depending upon the position of coupling switch 22.

FIG. 1A shows an alternative embodiment which may be utilized to produce a reference signal having twice the frequency of the source signal itself. In this embodiment a frequency doubler 32 is interposed between the reference source 10 and the isolator pulse producing circuit 14.

FIG. 2 is a schematic diagram of one embodiment of a calibrating circuit incorporating the present invention. As shown therein, the input of the calibrating circuit is connected to a 60 cycle ac line, the source 10. The source 10 is connected to the input of an optoisolator 14 through a pair of current limiting resistors 32, 34. A diode 36 is connected across the input of the isolator 14, to limit the inverse peak voltage thereacross.

The output of the optoisolator 14 is a series of electrical pulses having a repetition rate equal to the frequency of the reference signal produced by source 10. This output is connected to an emitter follower amplifier 18. The output of the emitter follower 18 may be connected directly to the output 24 of the calibrator through the coupling switch 22 when in the position shown. Since many impulse tachometers are desirably responsive to impulses of the type generated by automotive ignition systems, the amplified output may be differentiated by differentiator 38.

The output of the emitter follower 18 is also connected to the input of a divide circuit such as the decade counter 24 through differentiator 38. The decade counter 24 produces an output pulse for every ten pulses received at its input. Thus the pulse repetition rate of the produced pulses may be divided by any suitable number, by a factor of ten in the disclosed embodiment, to produce at the output 24 a reduced number of simulating electrical pulses which may be amplified in an amplifier 28 and be differentiated by differentiator 40 to more accurately simulate the type of pulse received from the ignition system.

FIG. 2A shows an alternative embodiment for connecting the source 10 to the optoisolator 14. In the alternative embodiment, a full wave rectifier 42 is interposed between the source 10 and the limiting resistors 36, 38 to effectively double the frequency of the source 10 upon operation of frequency selector switch 44.

The calibrating circuit is particularly useful for battery powered operation and a power switch 46 is provided to disconnect the battery 48 from the calibrating circuit except when the calibrating circuit is being utilized.

Referring to FIG. 3, there is shown a block diagram of a typical impulse-type tachometer. In such a system, pulses generated by the automotive ignition system 50 are applied to the input of a constant amplitude pulse generator 52 through a connector switch 54. The constant amplitude pulse generator 52 produces pulses of constant amplitude and having a repetition rate equal to the repetition rate of the pulses received at its input.

These constant amplitude pulses are applied to a suitable meter 56 or other display device calibrated to display, in the case of a tachometer, rotational speed. Since the meter or other display devices typically operate on the principle of integrating the received pulses to provide a deflection proportional to the integral thereof as a function of time, the meter 56 is calibrated by adjusting the duration of the constant amplitude pulses by use of a timing circuit 57. The input for typical impulse tachometers is connected across the ignition breaker points and results in generation of impulses at a repetition rate corresponding not only to the rotational speed of the engine crank shaft but also determined by the number of cylinders.

A more convenient and simplified pulse tachometer of the type generally disclosed in the block diagram of FIG. 3 is shown in FIG. 4. The tachometer of FIG. 4 detects impulses generated by the automotive ignition system by capacitively coupling a clip 58 to one end of one spark plug wire 60. The detected high voltage impulse is applied to an input voltage divider comprising a pair of resistors 62, 64 without adversely loading the spark plug wire.

The voltage divided input is applied through connection switch 54 when in the position shown, across an input resistor 66 to the input of a solid state tachometer driving integrated circuit 68. The output of the driving circuit 68 is a plurality of constant amplitude pulses having a repetition rate corresponding to the repetition rate of the impulses received at the input of the pulse generator 68.

These pulses are applied through an integrating circuit 70 to a meter 72 or other display device. A meter suitable for use in the illustrated embodiment includes two scales one ranging between 0 and 1,000 rpm, a low scale, and the other ranging between 0 and 10,000 rpm, a high scale. In order to dynamically calibrate the meter, the timing circuit including timing capacitors 74, 76 and timing resistors 78-84 is utilized to adjust the duration of the constant amplitude pulses.

Calibration is effected for each of the two scales by operation of scale selection switches 86, 88, 90 shown in the position for calibrating the high scale. The scale selection switches 86-90, may be ganged to coupling switch 22. Calibration of the meter is effected in the high scale by adjusting variable timing resistor 80 and in the low scale by introducing additional capacitors 76, 92 into the circuit and by adjusting variable resistor 84.

The circuit of FIG. 4 utilizes a suitable voltage regulator 94 to minimize changes in voltage which is particularly desirable when the source 96 is an automotive battery. This minimizes the effect of voltage changes upon the accuracy of the system. The source 96 is connected to the tachometer through power switch 98. When the input selection switch 54 is moved from the position shown to a second position, the input to the tachometer constant pulse generator 68 is connected to the output 24 of the calibration circuit. Adjustment of either the high scale or low scale variable resistors 80, 84 provides the desired reading on the meter.

When used in connection with a four-cycle engine, the meter reads in rpm at a value twice the pulse repetition rate of the input pulses. In the illustrated embodiment, when the coupling switch in the calibrator is in the position shown, and a 60-cycle source is utilized, pulses are provided at a repetition rate of 3,600 ppm. When applied to the input of the impulse tachometer shown in FIG. 4, calibration in the high scale can occur at 7,200 rpm which is about 75% full scale reading and an ideal meter calibration point. The same calibration point is utilized for the low scale under which conditions the calibration coupler switch is connected to its second position so that the output is electrical pulses having a pulse repetition rate of 720 ppm. Again, calibration of the tachometer meter when set in the low scale mode is at about 75% of full scale reading, again an ideal calibration point. While the calibration circuit of the present invention has particular utility for use with a tachometer of the type shown in FIG. 4 in which the pulse repetition rate has a fixed relationship to speed of rotation, it may also be utilized to calibrate the tachometers in which adjustments are required for the number of cylinders.

The calibration circuit of the present invention may conveniently be combined with a tachometer in which case scale selection switches 86, 88, 90 and coupling switch 22 may also be combined or operated in unison.

One example of the disclosed embodiment includes components as follows:

| | Resistance |
|---|---|
| $R_1$ | 10K |
| $R_2$ | 10K |
| $R_3$ | 7.5K |
| $R_4$ | 1K |
| $R_5$ | 6.8K |
| $R_6$ | 1K |
| $R_7$ | 10K |
| $R_8$ | 27K |
| $R_9$ | 820Ω |
| $R_{10}$ | 220K |
| $R_{11}$ | 5.6K |
| $R_{12}$ | 10K |
| $R_{13}$ | 270Ω |
| $R_{14}$ | 150Ω |
| $R_{15}$ | 10K |
| $R_{16}$ | 3.9K |
| $R_{17}$ | 10K |
| $R_{18}$ | 5.1K |
| $R_{19}$ | 25K |
| $R_{20}$ | 430Ω |
| | Capacitance |
| $C_1$ | 0.1 μF |
| $C_2$ | 0.5 μF |
| $C_3$ | 0.01 μF |
| $C_4$ | 0.1 μF |
| $C_5$ | 0.01 μF |
| $C_6$ | 0.1 μF |
| $C_7$ | 220 μF |
| $C_8$ | 220 μF |
| $C_9$ | 0.1 μF |
| $C_{10}$ | 1 μF |
| $C_{11}$ | 4 μF |
| $C_{12}$ | 47 μF |
| $C_{13}$ | 100 μF |
| IC-1 | G.E. H11A2 Photon Coupled Isolator or Equivalent |
| IC-2 | Signetics N7490A Decade Counter or Equivalent (e.g. Fairchild 9350) |
| IC-3 | ITT SK115 Tachometer Driver or Equivalent (e.g. Stewart Warner SW781) |
| $D_1$ | IN 60 Germanium Diode |
| $D_2$ | IN 5231 Zenor Diode |
| $D_3$ | IN 5236 Zenor Diode |
| $Q_1$ | 2N 5133 |
| $Q_2$ | 2N 5133 |
| $Q_3$ | 2N 5133 |
| $Q_4$ | 2N 5133 |
| $Q_5$ | 2N 5133 |

Thus there has been disclosed a calibration circuit for generating reference pulses simulating the valve of a condition to be measured by a measuring circuit for permitting accurate and simplified calibration of the measuring circuit. The calibration circuit of the present invention is simple and accurate, and provides an easy technique for accurate calibration.

From the foregoing, it will be observed that numerous variations and modifications may be effected without departing from the true spirit and scope of the novel concept of the invention. It is, of course, intended to cover by the appended claims all such modifications as fall within the scope of the claims.

What is claimed is:

1. In combination, an impulse tachometer and a calibration circuit therefor, said tachometer including:
means for generating constant amplitude electrical pulses in response to the application of electrical pulses at the input thereof, said constant amplitude electrical pulses having a repetition rate equal to the repetition rate of said applied electrical pulses;
means for alternatively applying to the input of said constant amplitude pulse generating means either said input electrical pulses having a repetition rate determined by the speed of rotation of a rotating device or simulating electrical pulses produced by said calibration circuit; and
means for displaying said speed of rotation in response to said constant amplitude electrical pulses as a function of the repetition rate and duration thereof; and means for adjusting the duration of said constant amplitude pulses, whereby said display means may be calibrated to accurately display the speed of rotation represented by said input pulses;
said calibration circuit generating electrical pulses of known repetition rate at the output thereof for simulating a selected speed of rotation, and including:

means for connecting the input of said calibration circuit to a line source generating a reference signal of known frequency;

optoisolator circuit means, said optoisolator circuit means producing electrical pulses having a repetition rate equal to the frequency of said reference signal and electrically isolated therefrom;

current limiting means connecting said reference signal source to said optoisolator circuit means, means connecting the output of said optoisolator circuit means to the input of pulse altering circuit means, said pulse altering circuit means altering said electrical pulses by producing at its output electrical pulses having a reduced repetition rate equal to one electrical pulse for every x electrical pulses received at its input, where x is an integer greater than 1; and switch means selectively operable to provide at the output of said calibration circuit as said simulating electrical pulses either said produced electrical pulses or said altered electrical pulses.

2. A combination as claimed in claim 1 wherein said source generates a reference signal having a frequency of between about 25Hz. and about 120Hz.

3. A combination as claimed in claim 2 wherein said source generates a reference signal having a frequency of substantially 60Hz., wherein $x=10$, whereby said optoisolator circuit means produces pulses having a repetition rate of 3600 ppm, and said altering circuit means produces electrical pulses having a repetition rate of 360ppm.

4. A combination as claimed in claim 3 wherein the speed of rotation displayed by said display means is twice the pulse repetition rate of pulses received at the input of said constant amplitude pulse generating means;

wherein said display means is a meter providing at full scale deflection a reading in excess of 7500 rpm on a first, high scale and in excess of 750 rpm on a second, low scale; and which includes meter scale selection means for selecting one of said meter scales, said meter scale selection means including said selectively operable switch means, whereby said tachometer may be calibrated by operating said connecting means to connect the output of said calibration circuit to the input of said constant amplitude pulse generating means and by operating said adjusting means to adjust the duration of said constant amplitude pulses so said meter reads 7200 rpm when said scale selecting means is operated to select said high scale and said meter reads 720 rpm when said scale selecting means is operated to select said low scale.

* * * * *